United States Patent [19]

Takenaka et al.

[11] Patent Number: 4,706,165
[45] Date of Patent: Nov. 10, 1987

[54] MULTILAYER CIRCUIT BOARD

[75] Inventors: Takaji Takenaka; Hideki Watanabe; Haruhiko Imada, all of Hadano, Japan

[73] Assignees: Hitachi Microcomputer Engineering Co., Ltd.; Hitachi, Ltd., both of Tokyo, Japan

[21] Appl. No.: 918,918

[22] Filed: Oct. 15, 1986

[30] Foreign Application Priority Data

Oct. 15, 1985 [JP] Japan .................. 60-229296

[51] Int. Cl.⁴ .............................................. H05K 1/18
[52] U.S. Cl. .................................. 361/403; 174/68.5; 361/404; 361/412; 361/414
[58] Field of Search ............... 174/68.5; 361/414, 412, 361/404, 403, 406

[56] References Cited

U.S. PATENT DOCUMENTS

| | | | |
|---|---|---|---|
| 3,605,063 | 9/1971 | Stewart | 361/414 X |
| 3,898,370 | 8/1975 | Davy et al. | 361/414 X |
| 4,016,463 | 4/1977 | Beall et al. | 361/397 X |
| 4,150,421 | 4/1979 | Nishihara et al. | 361/414 X |
| 4,254,445 | 3/1981 | Ho | 174/68.5 X |
| 4,434,321 | 2/1984 | Betts | 361/414 X |
| 4,464,704 | 8/1984 | Huie et al. | 361/414 |
| 4,546,413 | 10/1985 | Feinberg et al. | 361/395 X |

OTHER PUBLICATIONS

Drumm et al., EC Pad for Multi-Chip-Module Substrate Nets, IBM Tech. Disc. Bull., V. 21, #12, May 1979, p. 4801.

Primary Examiner—R. R. Kucia
Attorney, Agent, or Firm—Antonelli, Terry & Wands

[57] ABSTRACT

In a multilayer circuit board wherein a plurality of electronic parts are provided on a first principal plane, a plurality of brazing pads for pins are respectively arranged on a second principal plane and a plurality of wiring layers having wiring nets for connecting said electrical parts are formed between these principal planes. The EC pads for I/O leads for connecting discrete wires is provided to said first principal plane. EC pads are provided on said second principal plane and are connected to the brazing pads for pins in such a manner as to be electrically separable as required. The EC pads for I/O leads and the brazing pads for pins are connected through the interior of the multilayer circuit board and the EC pads are connected to the wiring net through the interior of the multilayer circuit board.

4 Claims, 6 Drawing Figures

MULTILAYER CIRCUIT BOARD

BACKGROUND OF THE INVENTION

The present invention relates to a multilayer circuit board and more particularly to a multilayer circuit board which is suitable for engineering change such as wiring changes.

Wiring changes between semiconductor devices have been conducted by providing engineering change pads (hereinafter referred to as EC pads) to the part mounting plane of a multilayer ceramic substrate, wiring semiconductor devices through said PC pads with possibility for disconnection of intermediate sections of said EC pads, executing wiring changes through disconnection of said intermediate sections and connecting a discrete wire to the EC pads. This system is described in the U.S. Pat. No. 4,245,273.

Moreover, such wiring changes have also been realized by disconnecting between the bonding pads and through holes for wiring nets and connecting a discrete wire to the bonding pads under the condition that connections are guided to a second principal plane from the first principal plane for mounting electronic parts through the through holes. The connections are made through the through holes for connection of internal wiring patterns to the bonding pads for connecting discrete wires. This system is described in the U.S. Pat. No. 4,016,463.

However, in comparison with the former and the latter systems, the discrete wire is laid on the electronic parts mounting plane in the former case while it is laid on the opposed plane in the latter case. But, both systems only allow wiring changes.

SUMMARY OF THE INVENTION

It is an object of the present invention to provide a multilayer circuit board which mounts electronic parts on the first principal plane, arranges input/output (I/O) pads on the second principal plane, realizes engineering changes such as wiring changes between all electronic parts and between all electronic parts and all input/output pads, and assures compatibility as hybrid modules.

In U.S. Pat. No. 4,245,273, it can be supposed to use an auxiliary input/output pads as the conceivable means in order to change wiring nets to be connected to the I/O lead. As a result, however, location of input/output pads changes and thereby the upper medium for wire mounting this module is required to change the wiring. Therefore, in view of changing closed modification within a module without giving any adverse effect to the upper medium for wiring, an EC pad is provided in the patterns connecting the input/output pads and wiring net at the second principal plane arranging the input/output pads and wiring between the EC pad and input/output pad is disconnected with a laser beam. For regular connections to the disconnected input/output pad after the engineering changes, a discrete wire is connected to the EC pad for I/O leads of the first principal plane mounting electronic parts extended from the input/output pad of the second principal plane.

Moreover, a discrete wire connection pad connected to the input/output pad and EC pad is provided to the second principal plane in order to realize, on the second principal plane, the pattern cut and discrete wiring as in the case of the first principal plane. Thereby, repairs for every kind of open/short-circuit of wiring nets and every engineering change can be done without changing the interface with the upper medium of wiring.

DETAILED DESCRIPTION OF THE PREFERRED EMBODIMENTS

Figure 6:
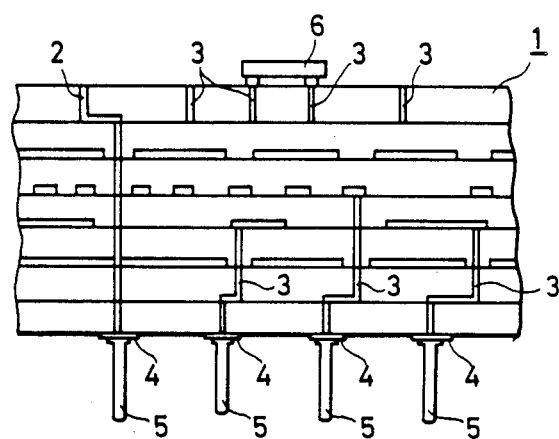
FIG. 6 is a sectional view of a multilayer circuit board of the prior art.

Prior to explanation of an embodiment of the present invention, a known multilayer ceramic substrate will be outlined with reference to FIG. 6 for assisting understanding of the present invention.

In FIG. 6, the first principal plane of the multilayer ceramic substrate 1 is soldered with many electronic parts 6 (only one is illustrated in the drawing), while the second principal plane is provided with brazing pads for pins 4 and is brazed thereon with the I/O pin 5. The brazing pads for pins 4 are connected to the signal wiring layer in the ceramic substrate 1 through a through hole 3. A numeral 2 denotes a through hole for power supply.

Figure 1:
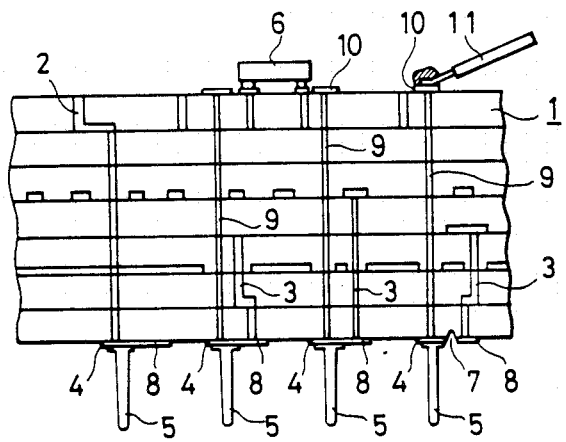
FIG. 1 is a sectional view of a multilayer circuit board illustrating an embodiment of the present invention.
Figure 2:
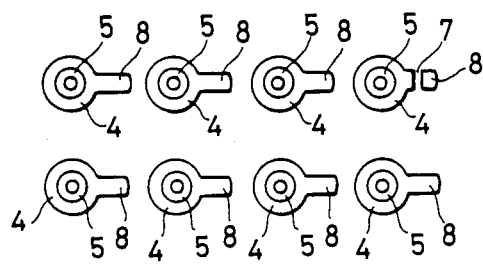
FIG. 2 is a partial plan view of the second principal plane of the board illustrated in FIG. 1.

In FIGS. 1 and 2 which illustrate an embodiment of the present invention, the brazing pads for pins 4 are coupled with the EC pads 8 and these pads are formed in the wiring patterns which can be electrically separated by the laser beam. FIG. 2 is an example of such shape. A through hole for signal wiring 3 in the ceramic substrate is extended from the EC pads 8. Moreover, the first principal plane mounting electronic parts is provided with EC pads 10 for I/O pins 11 and the through hole 9 coupled with the brazing pads for pins 4 is connected to said pads 10.

In such a structure, if wiring change or other engineering change occurs, the brazing pads for pins 4 and an intermediate connecting part 7 of the EC pad 8 are disconnected by a laser beam and the I/O pins 5 are separated from the through hole 3. Thereafter the discrete wire 11 is soldered to the EC pad for I/O pins 10.

A reference numeral 7 denotes a part cut by the laser beam.

According to the present invention, engineering change of a wiring net to be connected to the brazing pads for pins can be realized and therefore economization and productivity of multilayer circuit coard can be improved.

Moreover, in connection to the upper medium for wiring, location of the brazing pads for pins is not changed depending on the engineering change and therefore compatibility can be maintained at the module level.

Figure 3:
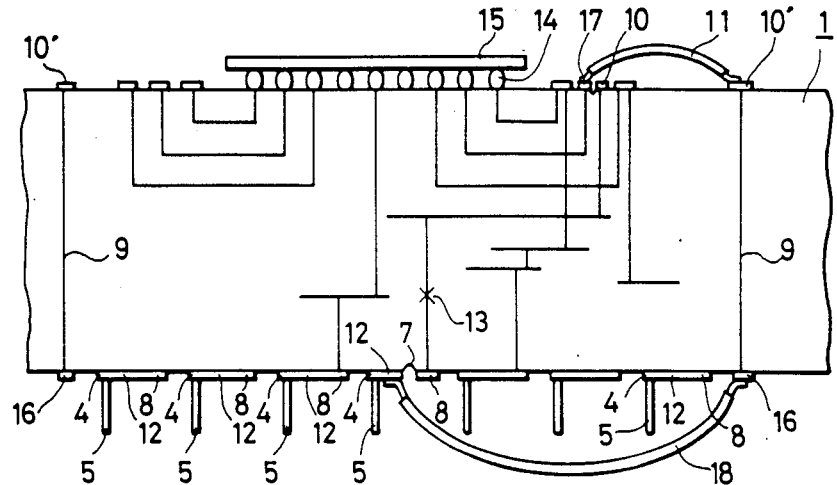
FIG. 3 is a sectional view of the board illustrating another embodiment of the present invention.
Figure 4:
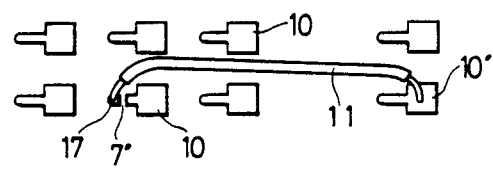
FIG. 4 is a plan view illustrating a part of the EC pads provided on the first principal plane of the embodiment shown in FIG. 3.
Figure 5:
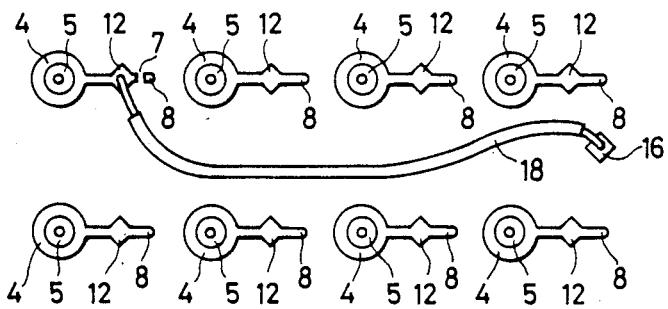
FIG. 5 is a plan view illustrating a part of the second principal plane of FIG. 3.

FIGS. 3 to 5 illustrate a multilayer circuit board of another embodiment of the present invention. In FIG. 3, a reference numeral 15 denotes a semiconductor device arranged on the first principal plane of this substrate 1; and 14 designates a fine solder ball for connecting this device 15 to a wiring net. As illustrated in FIG. 4, many EC pads 10, 10' are provided on the first principal plane surrounding the device 15 and these EC pads can be separated electrically, if necessary, by the laser beam at the part 7'. As illustrated in FIG. 5, the brazing pads for pins 4, I/O pins 5 connected to said pads 4, EC pads 8 connected to the pads 4 and pads for discrete wire 12 (each of these pads 12 is a type of EC pad) between the pad 4 and pad 8 are provided on the second principal plane of the substrate. The part between these pads 4, 12 and 8 can be electrically separated, if necessary, by the laser beam. Moreover, discrete connection pads 16 (which is also a type of EC pad) is also provided to the second principal plane of the substrate 1. The EC pads 10' on the first principal plane are connected through a through hole 9.

Here, open wiring at the part 13 of wiring net within the substrate 1 will be explained. A pattern of pad 10 which is a terminal on the first principal plane of the opening net is divided at the part 7' (as shown in FIG. 4) and the divided end part 17 and the EC pad 10' are connected with a discrete wire 11. Moreover, the pad 8 which is a terminal on the second principal plane of such opening net is separated from the pad 12 at the part 7. The separated pad 12 and the EC pad 16 are connected with a discrete wire 18. Thereby, continuity of said open net can be recovered. The interface of this multilayer circuit board 1 and the upper medium for wiring are the same, assuring compatibility.

With provision of pad patterns as illustrated in FIGS. 4 and 5 and a through hole 9 as illustrated in FIG. 3, repairs for every kind of open and short-circuit occurring in the multilayer circuit board 1 and all conceivable engineering changes can be realized and moreover the interfaces with upper medium for wiring becomes the same, assuring compatibility.

What is claimed is:

1. A multilayer circuit board comprising:
   a first principal plane having a plurality of first pads connected to electronic components and a plurality of second pads connected to said plurality of first pads, respectively;
   a second principal plane having a plurality of third pads arranged in a plurality of rows and connected to a plurality of I/O leads, respectively;
   a plurality of fourth pads arranged on said second principal plane connected to said plurality of third pads, respectively, said connection between said third pads and said fourth pads being electrically separable;
   a first wiring net for connecting said second pads to said fourth pads;
   a plurality of fifth pads arranged on said first principal plane so as to be electrically connected to said first pads via first discrete wires;
   a plurality of sixth pads arranged on said second principal plane between said rows of third pads, each of said plurality of sixth pads corresponding to a predetermined plurality of said third pads; and
   a second wiring net connected to said fifth and sixth pads;
   wherein one of said third pads is connected to said corresponding one of said sixth pads via second discrete wires, such that said one of said third pads is connected to said second wiring net when said one of said third pads is electrically separated from said fourth pad connected to said one of said third pads.

2. A multilayer circuit board according to claim 1, wherein said corresponding one of said sixth pads is electrically separated from said one of said third pads when said one of said third pads is connected to said fourth pad.

3. A multilayer circuit board according to claim 1, wherein said second pads comprise seventh and eighth pads,
   said seventh pads being electrically connected to said first pads;
   said eighth pads being connected to said first wiring net;
   said seventh and eighth pads being electrically separable; and
   at least one of said seventh pads being electrically connected to at least one of said fifth pads via one of said first discrete wires when said at least one of said seventh pads is electrically separated from a corresponding one of said eighth pads.

4. A multilayer circuit board according to claim 1, wherein said third and fourth pads are connected along the longitudinal direction of said rows.

* * * * *